United States Patent
Lee et al.

(10) Patent No.: US 9,831,871 B2
(45) Date of Patent: Nov. 28, 2017

(54) TOUCH PANEL COMPRISING A PIEZOELECTRIC MATERIAL

(71) Applicant: LG INNOTEK CO., LTD., Seoul (KR)

(72) Inventors: Sang Young Lee, Seoul (KR); Ji Sun Yun, Seoul (KR); Yong Jin Lee, Seoul (KR); Kyoung Hoon Chai, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 429 days.

(21) Appl. No.: 14/387,297

(22) PCT Filed: Mar. 21, 2013

(86) PCT No.: PCT/KR2013/002366
§ 371 (c)(1),
(2) Date: Sep. 23, 2014

(87) PCT Pub. No.: WO2013/141634
PCT Pub. Date: Sep. 26, 2013

(65) Prior Publication Data
US 2015/0090572 A1 Apr. 2, 2015

(30) Foreign Application Priority Data
Mar. 23, 2012 (KR) .................. 10-2012-0029646

(51) Int. Cl.
*G06F 3/041* (2006.01)
*H03K 17/96* (2006.01)
(Continued)

(52) U.S. Cl.
CPC ......... *H03K 17/9622* (2013.01); *G06F 3/044* (2013.01); *G06F 3/0414* (2013.01); *H01L 41/0986* (2013.01); *H01L 41/193* (2013.01); *H03K 2217/96062* (2013.01); *H03K 2217/960745* (2013.01); *H03K 2217/960755* (2013.01)

(58) Field of Classification Search
CPC .... G06F 3/044; H01L 41/0986; H01L 41/193
USPC ........................................................ 345/173
See application file for complete search history.

(56) References Cited

U.S. PATENT DOCUMENTS

| 7,215,329 B2 | 5/2007 | Yoshikawa et al. |
| 7,663,604 B2 | 2/2010 | Maruyama et al. |

(Continued)

FOREIGN PATENT DOCUMENTS

| CN | 1678978 | 10/2005 |
| CN | 10-1825967 | 9/2010 |

(Continued)

OTHER PUBLICATIONS

International Search Report dated Jul. 11, 2013 issued in Application No. PCT/KR2013/002366.

(Continued)

*Primary Examiner* — Jonathan Blancha
(74) *Attorney, Agent, or Firm* — KED & Associates, LLP

(57) ABSTRACT

A touch panel according to the embodiment includes a substrate including an effective area and a dummy area surrounding the effective area; a transparent electrode on the substrate; and an outer dummy layer on the dummy area, wherein the outer dummy layer comprises a piezoelectric material.

15 Claims, 3 Drawing Sheets

(51) Int. Cl.
*G06F 3/044* (2006.01)
*H01L 41/09* (2006.01)
*H01L 41/193* (2006.01)

(56) References Cited

U.S. PATENT DOCUMENTS

| | | | |
|---|---|---|---|
| 2003/0067449 A1* | 4/2003 | Yoshikawa | G06F 3/016 345/173 |
| 2005/0073505 A1* | 4/2005 | Katsuki | G06F 3/0436 345/173 |
| 2005/0174336 A1* | 8/2005 | Nakayama | G06F 3/045 345/173 |
| 2007/0236450 A1* | 10/2007 | Colgate | G06F 3/016 345/156 |
| 2009/0309616 A1 | 12/2009 | Klinghult et al. | |
| 2010/0013737 A1 | 1/2010 | Dwivedi | 343/908 |
| 2010/0013797 A1 | 1/2010 | Kim et al. | 345/176 |
| 2011/0053653 A1 | 3/2011 | Tho et al. | |
| 2011/0062969 A1 | 3/2011 | Hargreaves et al. | 324/658 |
| 2011/0115734 A1 | 5/2011 | Harashima et al. | |
| 2011/0128245 A1* | 6/2011 | Andoh | H04R 17/005 345/173 |
| 2011/0267290 A1* | 11/2011 | Park | G06F 3/044 345/173 |
| 2012/0113156 A1* | 5/2012 | Lim | G09G 3/3629 345/690 |
| 2013/0027340 A1* | 1/2013 | Kodani | G06F 3/041 345/173 |

FOREIGN PATENT DOCUMENTS

| | | |
|---|---|---|
| CN | 10-2169387 | 8/2011 |
| JP | 2006-215738 | 8/2006 |
| JP | 2011-221720 A | 11/2011 |
| KR | 10-0659048 B1 | 12/2006 |
| KR | 10-2010-0118680 A | 11/2010 |
| TW | M393736 U1 | 12/2010 |

OTHER PUBLICATIONS

Chinese Office Action dated Jun. 23, 2016 issued in Application No. 201380016044.7 (English translation attached).
Taiwanese Office Action dated Dec. 8, 2014 issued in Application No. 102110243 (with English translation).
Chinese Office Action dated Sep. 30, 2017 issued in Application No. 201380016044.7 (English translation attached).

* cited by examiner

[Fig. 1]
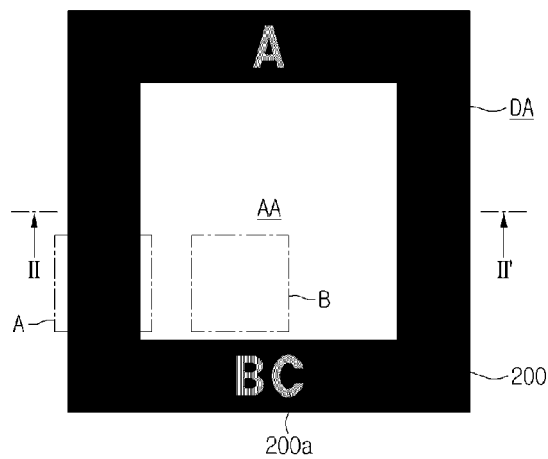
[Fig. 2]
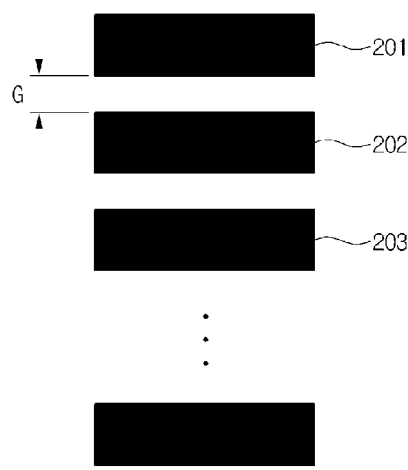
[Fig. 3]
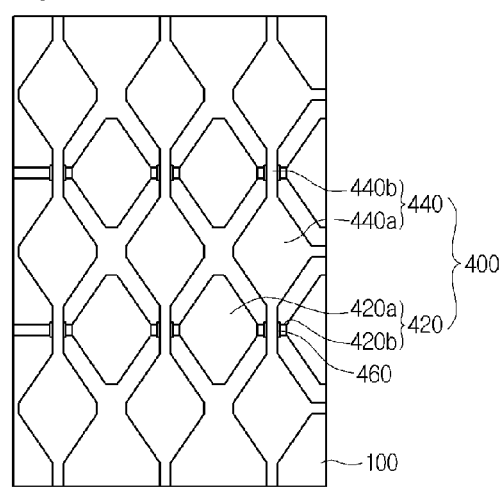

[Fig. 4]
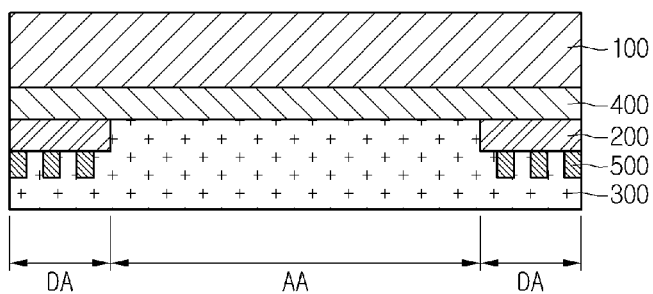
[Fig. 5]
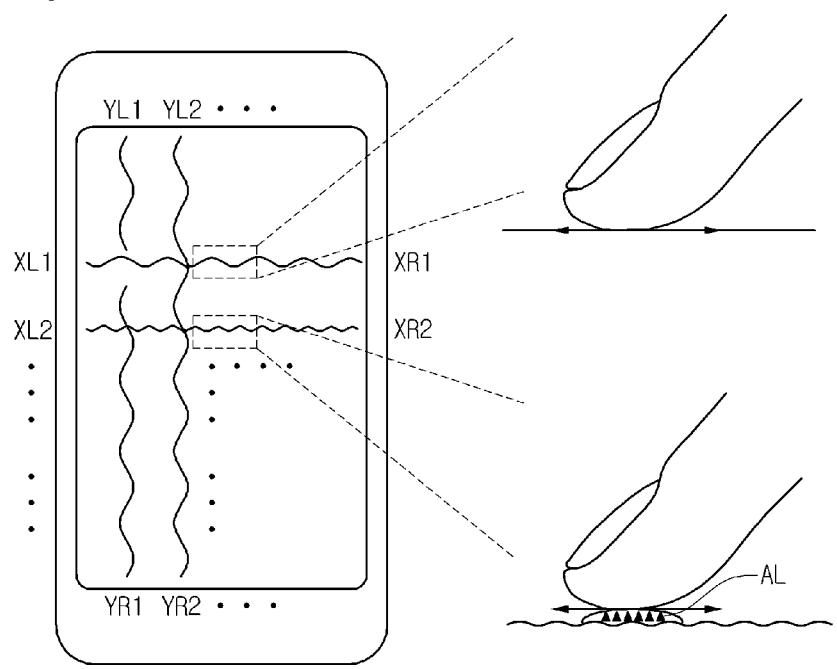
[Fig. 6]
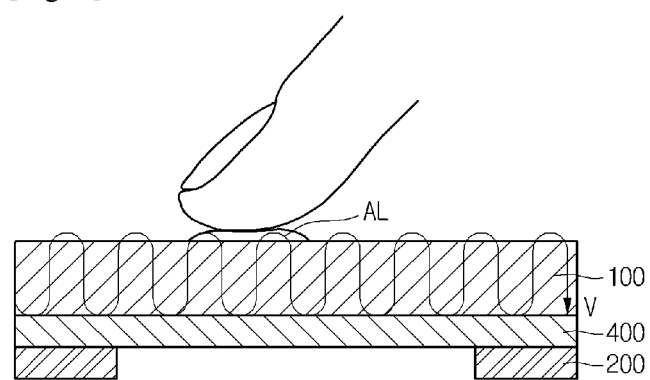

[Fig. 7]
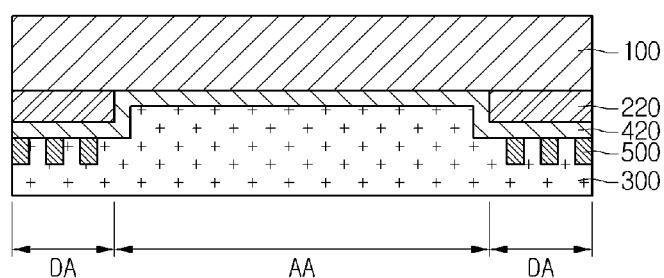

TOUCH PANEL COMPRISING A PIEZOELECTRIC MATERIAL

CROSS-REFERENCE TO RELATED PATENT APPLICTIONS

This application is a U.S National Stage Application under 35 U.S.C. §371 of PCT Application No. PCT/KR2013/002366, filed Mar. 21, 2013, which claims priority to Korean Patent Application No. 10-2012-0029646, filed Mar. 23, 2012, whose entire disclosures are hereby incorporated by reference.

TECHNICAL FIELD

The disclosure relates to a touch panel.

BACKGROUND ART

A resistive type touch panel and a capacitive type touch panel according to the related art may simply recognize only location information of a touch but cannot recognize strength or force of the touch when all screen inputs are achieved. In addition, since a touch panel layer is placed at a top end of a display layer, a structure becomes complicated and the visibility of a display is degraded. Accordingly, researches and studies have been performed toward a touch panel using a piezoelectric element other than an existing scheme.

Since the piezoelectric element has a property capable of converting a mechanical signal such as pressure into an electric signal, the piezoelectric element has been extensively used for a sensor such as a pressure sensor or an ultrasonic sensor.

However, as the electronic appliances have been extensively used, there are various demands of users to use the electronic appliances having various functions. Accordingly, there is a need to maximize user's experience by providing various feedbacks, such as tactile sense feedbacks or partial tactile feedbacks, when touching a touch panel.

DISCLOSURE OF INVENTION

Technical Problem

The embodiment provides a touch panel capable of realizing a unique tactile sense.

Solution to Problem

According to the embodiment, there is provided a touch panel including: a substrate including an effective area and a dummy area surrounding the effective area; a transparent electrode on the substrate; and an outer dummy layer on the dummy area, wherein the outer dummy layer comprises a piezoelectric material.

Advantageous Effects of Invention

The touch panel according to the embodiment includes a plurality of outer dummy layers with the piezoelectric material. The colors of the outer dummy layers may be variously implemented according to the piezoelectric material having the color.

The outer dummy layers can provide various tactile senses according to an intensity of touch pressure by pressure recognition. That is, the outer dummy layers can generate a piezoelectric effect.

Accordingly, the intensity and location of pressure can be deleted due to generation of a voltage at a touched point according to the touch pressure through the outer dummy layers.

Since a separate piezoelectric layer for providing a vibrating force may be omitted due to the outer dummy layers, thickness reduction may be achieved. Further, a user's experience can be maximized by implementing the feedback through the touch pressure. That is, the accuracy of the touch pressure can be improved by implementing tactile sense feedback on a touch panel through the outer dummy layers, and the user's experience can be maximized by providing the feeling of textures. In detail, roughness or softness of an object displayed on a display can be provided.

Further, a plurality of outer dummy layers are provided so that a tactile sense may be impressed to a plurality of partial areas. Mutually different tactile sense feedbacks can be generated from a plurality of partial areas XL, XR, YL, and YR. Accordingly, various tactile senses can be represented due to overlap vibration of four surfaces of up, down, left and right surfaces. In addition, beats can be induced to a surface where tactile senses are generated due to the interaction of partial vibrations, and various types of vibration patterns may be generated.

In addition, when an input tool such as a finger touches a top surface of the substrate, a voltage and an excitation frequency vary, and the outer dummy layer generates an ultrasonic wave so that the substrate may vibrate. Pressure of an air layer between the finger and the substrate may vary due to the vibration of the substrate. In addition, a viscosity of the air layer may vary to generate a tactile sense, and a unique tactile sense can be provided. That is, when touched, a tactile sense caused by variations in the viscosity and pressure property of the air layer may be provided by adjusting excitation frequency characteristics.

Further, a direction of mobility may be presented through vibration flow. That is, a dynamic haptic may be presented by generating sequential or composite flows of the outer dummy layer. Accordingly, the user may feel directionality or a dynamic state of a graphic object from a screen of a touch panel through the tactile sense. Therefore, a bowling or basketball game may be provided through the touch panel.

In addition, since a haptic actuator is formed at the dummy area DA, the haptic actuator may not exert an influence on optical or electric characteristics of the touch panel, so that the reliability of the touch panel can be improved.

BRIEF DESCRIPTION OF DRAWINGS

FIG. 1 is a schematic plan view showing a touch panel according to the first embodiment.

FIG. 2 is an enlarged plan view of an 'A' portion of FIG. 1.

FIG. 3 is an enlarged plan view of a 'B' portion of FIG. 1.

FIG. 4 is a sectional view taken along line II-II' of FIG. 1.

FIGS. 5 and 6 are views illustrating driving of the touch panel according to the embodiment.

FIG. 7 is a sectional view showing a touch panel according to a second embodiment.

MODE FOR THE INVENTION

In the description of the embodiments, it will be understood that when each layer (film), region, pattern or structure is referred to as being "on" or "under" another layer (film), region, pattern or structure, it can be "directly" or "indirectly" on the other layer (film), region, pattern or structure or one or more intervening layers may also be present. Such a position has been described with reference to the drawings.

The thickness and size of each layer (film), region, patter or structure shown in the drawings may be modified for the purpose of convenience or clarity. In addition, the size of the elements does not utterly reflect an actual size.

Hereinafter, embodiments will be described in detail with reference to accompanying drawings.

First, a touch panel according to the first embodiment will be described in detail with reference to FIGS. 1 to 6.

FIG. 1 is a schematic plan view showing a touch panel according to the first embodiment. FIG. 2 is an enlarged plan view of an 'A' portion of FIG. 1. FIG. 2 is an enlarged plan view of a 'B' portion of FIG. 1. FIG. 2 is a sectional view taken along line II-II'of FIG. 1. FIGS. 5 and 6 are views illustrating driving of the touch panel according to the embodiment.

Referring to FIGS. and 4, the touch panel 10 according to the first embodiment includes an effective area AA for detecting apposition of an input device and a dummy area DA disposed around the effective area AA.

A transparent electrode 400 for detecting the input device may be formed on the effective area AA. In addition, a wire 500 connected to the transparent electrode 400 and a printed circuit board (not shown) connecting the wire 500 to an external circuit (not shown) may be formed on the dummy area DA. An outer dummy layer 200 may be formed on the dummy area DA and a logo 200a may be formed on the outer dummy layer 200. Hereinafter, the touch panel 10 having the above structure will be described in more detail.

A substrate 100 may be placed at the most upper portion of the touch panel 10.

The substrate 100 may be transparent. The substrate 100 may be a glass substrate including alkali glass such as soda glass or silicon acid boron glass, alkali-free glass, or chemical strengthening glass. In addition, the first substrate 100 may include a polyester film, such as transparent polyethyleneterephthalate or polyethylene-naphthalate (PEN), a polyimide film having thermal resistance and transparency, or a composite polymer having transparent characteristic such as polymethylmethacrylate or polycarbonate.

A protective film or an anti-finger coating layer may be further placed on a surface of the substrate 100.

A thickness of the substrate 100 may be in the range of 100 μm to 700 μm according to a material.

An input device such as a pen or a finger may be touched on the surface of the substrate 100.

The outer dummy layer 200 may be placed on a bottom surface of the substrate 100. The outer dummy layer 200 may be placed on the transparent electrode 400.

Referring to FIG. 2, the outer dummy layer 200 is placed along the dummy area DA. The outer dummy layer 200 may include a plurality of outer dummy layers 200. For example, the outer dummy layer 200 may include a first outer dummy layer 201, a second outer dummy layer 202, and a third outer dummy layer 203. The first outer dummy layer 201, the second outer dummy layer 202, and the third outer dummy layer 203 extend along the dummy area DA. The outer dummy layer 200 may serve as a single haptic actuator. That is, the outer dummy layer 200 serves as a pressure recognition layer.

The first outer dummy layer 201, the second outer dummy layer 202, and the third outer dummy layer 203 are spaced apart from each other. A gap G between the first outer dummy layer 201 and the second outer dummy layer 202 may be 3 μm or less. In detail, the gap G between the first outer dummy layer 201 and the second outer dummy layer 202 may be in the range of 0.1 μm to 3 μm. The gap G may not be recognized to the naked eye, so a user cannot recognize the space between the first outer dummy layer 201 and the second outer dummy layer 202. Accordingly, the outer dummy layer 200 may be recognized as one area rather than a plurality of layers.

The outer dummy layer 200 includes a piezoelectric material. That is, the outer dummy layer 200 includes a piezoelectric polymer material. For example, the outer dummy layer 200 may include polyvinylidene fluoride (PVDF). However, the embodiment is not limited thereto. That is, the outer dummy layer 200 may include various polymer materials such as polytetrafluoroethylene (PTFE).

Referring to FIG. 4, the outer dummy layer 200 is illustrated as one layer, but the embodiment is not limited thereto. Accordingly, the outer dummy layer 200 may include a plurality of layers, and one of the layers may include the piezoelectric material. That is, the outer dummy layer is formed by two-stage or three-stage printing, and one of the printing layers may be formed as a piezoelectric layer.

The outer dummy layer 200 may have a predetermined color such that the wire 500 and the printed circuit board placed at the dummy area DA may not be viewed from the outside. The outer dummy layer 200 may have a predetermined color suitable for the external appearance of the outer dummy layer 200. For instance, the outer dummy layer 120 may include a black pigment to represent a black color. Further, the color of the outer dummy layer 200 may be implemented in various schemes according to a piezoelectric material. In addition, a desired log 200a (see, FIG. 1) may be formed on the outer dummy layer 200 in various schemes.

The outer dummy layer 200 can provide various tactile senses according to an intensity of touch pressure by pressure recognition. That is, the outer dummy layer 200 may generate a piezoelectric effect. The piezoelectric effect refers to a phenomenon where a voltage is generated when pressure is applied to an object and the object expands or contracts when a voltage is applied to the object.

That is, the intensity and location of pressure can be detected due to generation of a voltage at a touched point according to the touch pressure through the outer dummy layers.

Since a separate piezoelectric layer for providing a vibrating force may be omitted due to the outer dummy layers 200, thickness reduction may be achieved. Further, a user's experience can be maximized by implementing the feedback through the touch pressure. That is, the accuracy of the touch pressure can be improved by implementing tactile sense feedback on a touch panel through the outer dummy layers 200, and the user's experience can be maximized by providing the feeling of textures. In detail, roughness or softness of an object displayed on a display can be provided.

Referring to FIG. 5, a plurality of outer dummy layers 200 are provided so that a tactile sense may be impressed to a plurality of partial areas. Mutually different tactile sense feedbacks can be generated from a plurality of partial areas XL, XR, YL, and YR. Accordingly, various tactile senses can be represented due to overlap vibration of four surfaces of up, down, left and right surfaces. In addition, beats can be induced to a surface where tactile senses are generated due to the interaction of partial vibrations, and various types of vibration patterns may be generated.

Referring to FIG. 6, when an input tool such as a finger touches a top surface of the substrate 100, a voltage and an excitation frequency vary, and the outer dummy layer 200 generates an ultrasonic wave so that the substrate 100 may vibrate. Pressure of an air layer AL between the finger and the substrate 100 may vary due to the vibration V of the substrate 100. In addition, a viscosity of the air layer AL may vary to generate a tactile sense, and a unique tactile sense can be provided. That is, when touched, a tactile sense caused by variations in the viscosity and pressure property of the air layer AL may be provided by adjusting excitation frequency characteristics.

Further, a direction of mobility may be presented through vibration flow. That is, a dynamic haptic may be presented by generating sequential or composite flows of the outer dummy layer 200. Accordingly, the user may feel directionality or a dynamic state of a graphic object from a screen of a touch panel through the tactile sense. Therefore, a bowling or basketball game may be provided through the touch panel.

In addition, since a haptic actuator is formed at the dummy area DA, the haptic actuator may not exert an influence on optical or electric characteristics of the touch panel, so that the reliability of the touch panel can be improved.

The outer dummy layer 200 can be formed by patterning a piezoelectric film. For example, the outer dummy layer 200 may be patterned by laser scribing or pressing molding a piezoelectric film, which is formed by elongating and polarizing PVDF powder after melt-extruding the PVDF powder.

A transparent electrode 400 is formed on the substrate 100. The transparent electrode 400 may have various shapes suitable for detecting the touch of the input device, such as a finger.

For example, as shown in FIG. 3, the transparent electrode 400 may include a first transparent electrode 420 and a second transparent electrode 440. The first transparent electrode 420 may extend in a first direction. The second transparent electrode 440 may extend in a second direction crossing the first direction.

The first and second transparent electrodes 420 and 440 may include sensor units 420a and 440a for detecting the touch of the input device, such as the finger, and a connection units 420b and 440b for connecting the sensor units 420a and 440a, respectively.

Although the drawing shows that the first sensor unit 420a and the second sensor unit 440a have a diamond shape when viewed from the top, the embodiment is not limited thereto. Accordingly, the first sensor unit 420a and the second sensor unit 440a have various shapes such as a polygonal shape, a circular shape, or an elliptical shape when viewed from the top.

The first connection unit 420b of the first transparent electrode 420 connects the first sensor unit 420a in the first direction (transverse direction in the drawing) and the second connection unit 440b of the second transparent electrode 440 connects the second sensor unit 440a in the second direction (longitudinal direction in the drawing).

An insulating layer 460 is disposed at the intersection between the first connection unit 420b of the first transparent electrode 420 and the second connection unit 440b of the second transparent electrode 440 to prevent the electric short between the first and second transparent electrodes 420 and 440.

The insulating layer 460 may be formed by using a transparent insulating material capable of insulating the first and second connection units 420b and 440b from each other.

According to the embodiment, for instance, the sensor units 420a and 440b of the first and second transparent electrodes 420 and 440 are aligned on the same plane as a single layer. Thus, the use of the transparent conductive material may be diminished and the thickness of the touch panel 10 may be reduced.

In this manner, if the input device, such as the finger, touches the touch panel 10, capacitance difference may occur at the portion touched by the input device, so the portion having the capacitance difference may be determined as the contact position.

The transparent electrode 400 may include a transparent conductive material such that electricity may flow without interfering with transmission of light. The transparent electrode 400 may include a material having high conductivity and light transmittance of 80% or more in the visible ray band. For example, the transparent electrode 400 may include an oxide material such as an indium tin oxide (ITO) film, an indium zinc oxide (IZO) film, and a zinc oxide film. In addition, the transparent electrode 400 may include a carbon nano tube (CNT), a silver (Ag) nano wire, a graphene or a nano-mesh.

A thickness of the transparent electrode 400 may be in the range of 10 nm to 50 nm according to a material.

The transparent electrode 400 may be formed by depositing a material for the transparent electrode 400 on the substrate 100. For example, an indium tin oxide layer may be formed on an entire bottom surface of the substrate 100 through a sputtering scheme. Photoresist is coated through a photolithography technique generally known in the art and an exposure and development process is performed to form a desired pattern in which the indium tin oxide layer formed at a lower layer is exposed. Then, the exposed indium tin oxide layer is etched with an etching solution by using the photoresist pattern as an etching mask. The etching solution may include carboxylic acid solution, ferric chloride solution, hydrobromic acid solution, hydriodic acid solution, or aqua regia solution. Next, the photoresist is removed, so that the transparent electrode 400 having the pattern may be formed. However, the embodiment is not limited to the above, and the transparent electrode 400 may be formed through various processes such as a printing process or a laminating process.

The wire 500 which is electrically connected to the transparent electrode 400 may be placed a side of the transparent substrate 400. The wire 500 may include metal having high electrical conductivity. The wire 500 may include a material having a sheet resistance of 0.4 Ω/sq or less. For example, the wire 500 may include white gold, gold, silver, aluminum or copper. The wire 500 may include chrome, molybdenum, or nickel for enhancing adhesion. That is, the wire 500 may include at least one layer. The wire 500 may have a thickness in the range of 100 nm to 2000 nm.

Although not shown in the drawings, a printed circuit board (not shown) which is connected to the wire 500 may be further provided. Various types of printed circuit boards may be applied as the printed circuit board. For example, a flexible printed circuit board (FPCB) may be used as the printed circuit board.

Then, a metal material is formed and is etched with etching solution, such that a pattern of the wire 500 may be formed. The etching solution may be mixture solution of phosphoric acid, nitric acid, or acetic acid. However, the embodiment is not limited thereto, and the wire 500 may be formed through various processes such as a printing process or a laminating process.

A protection layer 300 for protecting the transparent electrode 400 and the wire 500 may be further provided.

Hereinafter, a touch panel according to the second embodiment will be described with reference to FIG. 7. For the purpose of simplicity and clarity, the description about the elements identical to or similar to those of the first embodiment will be omitted but only different parts will be described in detail.

FIG. 7 is a sectional view showing a touch panel according to a second embodiment.

In the touch panel 20 according to the second embodiment, an outer dummy layer 220 may be placed between a transparent electrode 420 and a substrate 100. That is, the outer dummy layer 220 may be placed on the substrate 100, and the transparent electrode 420 may be placed on the outer dummy layer 220 and the substrate 100. Accordingly, various structures of the touch panel can be ensured.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although a preferred embodiment of the disclosure has been described for illustrative purposes, those skilled in the art will appreciate that various modifications, additions and substitutions are possible, without departing from the scope and spirit of the invention as disclosed in the accompanying claims.

The invention claimed is:

1. A touch panel comprising:
   a substrate including an effective area and a dummy area surrounding four surfaces of the effective area, wherein the four surfaces of the effective area include an up surface, a down surface, a left surface and a right surface;
   a transparent electrode on the effective area of the substrate;
   an outer dummy layer on the dummy area surrounding the up surface, the down surface, the left surface and the right surface of the effective area; and
   a wire connected to the transparent electrode on the dummy area of the substrate;
   wherein the outer dummy layer is disposed between the substrate and the wire,
   wherein the outer dummy layer comprises a piezoelectric material having a color for preventing the wire from being seen from the outside, and
   wherein an area of the outer dummy layer is larger than an area of the wire,
   wherein the outer dummy layer comprise a plurality of outer dummy parts disposed on the substrate which are spaced apart from each other,
   wherein the plurality of outer dummy parts comprise a plurality of first outer dummy parts, a plurality of second outer dummy parts, a plurality of third outer dummy parts, and a plurality of fourth outer dummy parts,
   wherein the plurality of first outer dummy parts are disposed on the dummy area adjacent the up surface of the effective area, and the plurality of first outer dummy parts including at least three outer dummy parts spaced apart from each other,
   wherein the plurality of second outer dummy parts are disposed on the dummy area adjacent the down surface of the effective area, and the plurality of second outer dummy parts including at least three outer dummy parts spaced apart from each other,
   wherein the plurality of third outer dummy parts are disposed on the dummy area adjacent the left surface of the effective area, and the plurality of third outer dummy parts including at least three outer dummy parts spaced apart from each other,
   wherein the plurality of fourth outer dummy parts are disposed on the dummy area adjacent the right surface of the effective area, and the plurality of fourth outer dummy parts including at least three outer dummy parts spaced apart from each other,
   wherein each of the outer dummy parts is a single haptic actuator, and
   wherein the plurality of outer dummy parts generate tactile sense feedbacks from a plurality of partial areas.

2. The touch panel of claim 1, wherein a gap between a first outer dummy part and a second outer dummy part of the plurality of first outer dummy parts is in a range of 0.1 μm to 3 μm.

3. The touch panel of claim 2, wherein the plurality of first outer dummy part includes a third outer dummy part placed adjacent to the second outer dummy part of the plurality of first outer dummy parts.

4. The touch panel of claim 1, wherein the piezoelectric material of the outer dummy layer comprises a piezoelectric polymer material.

5. The touch panel of claim 1, wherein the outer dummy layer comprises polyvinylidene fluoride (PVDF).

6. The touch panel of claim 1, wherein the outer dummy layer is placed between the transparent electrode and the substrate.

7. The touch panel of claim 1, wherein the transparent electrode is placed between the substrate and the outer dummy layer.

8. The touch panel of claim 1, wherein the outer dummy layer is placed on the transparent electrode.

9. The touch panel of claim 1, wherein the outer dummy layer generates tactile sense feedbacks to a plurality of partial areas.

10. The touch panel of claim 1, wherein the outer dummy layer generates an ultrasonic wave so that the substrate vibrate when an input touches.

11. The touch panel of claim 1, wherein the outer dummy layer is formed by patterning a piezoelectric film.

12. A touch panel comprising:
    a substrate including an effective area and a dummy area surrounding four surfaces of the effective area, the four surfaces of the effective area including an up surface, a down surface, a left surface and a right surface;
    a transparent electrode on the effective area of the substrate;
    a pressure recognition layer on the dummy area; and
    a wire connected to the transparent electrode on the dummy area of the substrate;
    wherein the pressure recognition layer comprises a plurality of layers, wherein the plurality of layers includes a first pressure recognition layer and a second pressure recognition layer, wherein the first pressure recognition layer and the second pressure recognition layer are disposed on the dummy area located by the up surface of the effective area, wherein the first pressure recognition layer and the second pressure recognition layer are disposed on the dummy area located by the down surface of the effective area, wherein the first pressure recognition layer and the second pressure recognition layer are disposed on the dummy area located by the left surface of the effective area, wherein the first pressure recognition layer and the second pressure recognition layer are disposed on the dummy area located by the right surface of the effective area, wherein the pressure recognition layer has a color, and wherein the pressure recognition layer includes a piezoelectric material, wherein the pressure recognition layer comprise a plurality of pressure recognition parts disposed on the substrate which are spaced apart from each other, wherein the plurality of pressure recognition parts comprise a plurality of first pressure recognition parts, a plurality of second pressure recognition parts, a plurality of third pressure recognition parts and a plurality of fourth pressure recognition parts, wherein the plurality of first pressure recognition parts are disposed on the dummy area adjacent the up surface of the effective area, and the plurality of first pressure recognition parts include at least three outer pressure recognition parts spaced apart from each other, wherein the plurality of second pressure recognition parts are disposed on the dummy area adjacent to the down surface of the effective area, and the plurality of second pressure recognition parts include at least three outer pressure recognition parts spaced apart from each other, wherein the plurality of third pressure recognition parts are disposed on the dummy area adjacent to the left surface of the effective area, and the plurality of third pressure recognition parts include at least three outer pressure recognition parts spaced apart from each other, wherein the plurality of fourth pressure recognition parts are disposed on the dummy area adjacent to the right surface of the effective area, and the plurality of fourth pressure recognition parts include at least three outer pressure recognition parts spaced apart from each other, and wherein each of the pressure recognition parts is a single haptic actuator, wherein the plurality of pressure recognition parts generate tactile sense feedbacks from a plurality of partial areas.

13. The touch panel of claim 12, wherein a second pressure recognition part is spaced apart from a first pressure recognition part of the plurality of first pressure recognition parts, and a gap between the first pressure recognition part and the second pressure recognition part is in a range of 0.1 μm to 3 μm.

14. The touch panel of claim 13, wherein a third pressure recognition part placed adjacent to the second pressure recognition part of the plurality of first pressure recognition parts.

15. The touch panel of claim 14, wherein the second pressure recognition part is spaced apart from the third pressure recognition part.

* * * * *